(12) United States Patent
Bernstein et al.

(10) Patent No.: US 6,594,894 B1
(45) Date of Patent: Jul. 22, 2003

(54) PLANAR-PROCESSING COMPATIBLE METALLIC MICRO-EXTRUSION PROCESS

(75) Inventors: Gary H. Bernstein, Granger, IN (US); Richard Frankovic, Beaverton, OR (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/578,064

(22) Filed: May 24, 2000

Related U.S. Application Data

(63) Continuation-in-part of application No. 08/976,135, filed on Sep. 30, 1997.

(51) Int. Cl.$^7$ .......................... H01R 43/02; B21C 23/00
(52) U.S. Cl. .......................... 29/879; 29/874; 438/632; 438/646; 72/253.1; 72/273.5
(58) Field of Search .................... 29/874, 879, 875, 29/837, 841, 842, 843, 845, 852, 876; 438/632, 646, 661, 688, 624; 72/253.1, 273.5, 258, 254

(56) References Cited

U.S. PATENT DOCUMENTS 4,728,627 A * 3/1988 Mase et al. ................. 438/624
5,639,345 A    6/1997 Huang et al.

OTHER PUBLICATIONS

Wood et al., "Evidence for an Incubation Time in Electromigration Phenomena," 1991, 29th Annual Proceedings, Reliability Physics Symposium, pp. 70–76.*

* cited by examiner

Primary Examiner—Ljiljana Ciric
(74) Attorney, Agent, or Firm—William G. Auton

(57) ABSTRACT

Micromachined extrusions on the micrometer scale is realized using compressive stresses resulting from electromigration-induced mass transport in planarized conductors. Extrusions are formed through simple die patterns etched through a passivation layer overlaying the conductors.

2 Claims, 3 Drawing Sheets

PLANAR-PROCESSING COMPATIBLE METALLIC MICRO-EXTRUSION PROCESS

CROSS REFERENCE TO RELATED PATENT APPLICATIONS

This application is a continuation-in-part of co-pending parent application, U.S. Ser. No. 08/976,135, filed Sep. 30, 1997.

STATEMENT OF GOVERNMENTAL INTEREST

The invention herein may be manufactured or used by or for the Government for governmental purposes without the payment of any royalty thereon.

BACKGROUND OF THE INVENTION

The present invention relates to the field of microelectromechanical systems (MEMS) useful in electronic/photonic integrated circuitry.

MEMS systems have been under development with regard to micrometer scale mechanics analogous to large scale mechanical systems, and their fabrication typically utilizes planar processes used in integrated circuitry (IC) fabrication. Tiny mechanical parts have been made by patterning and etching in two-dimensional structures. A new micro-extrusion process is desired employing conventional VLSI planar processing techniques to mimic three-dimensional macroscopic extrusion processes used in industry. Prior experiments have shown that aluminum extrusions can be formed by forcing the metal through dies patterned in silicon dioxide. A desired goal is to eliminate mechanical parts that would be normally used to compress a billet of material to be extruded.

Past electromigration experiments have shown that simply applying a current to a conductor builds up a large force. Such forces generated by current flow cause aluminum wiring to move slowly, opening voids that generate wiring faults. As circuit geometries continue to shrink, wires become increasingly vulnerable to this detrimental effect. Such faults produced by electro-migration are discussed in U.S. Pat. No. 5,639,345 to Haung among others.

SUMMARY OF PREFERRED EMBODIMENTS OF THE INVENTION

In accordance with the invention, we advantageously employ this normally detrimental electromigration-induced force to act as a micron sized extrusion ram. Extrusion of a heated microsized billet segment, through a die comprising a shaped hole in a planar silicon dioxide microchip encapsulation, is produced by inducing stresses within the segment by creating electromigration therein, which stresses act like a ram to force the pliable heated segment material through the shaped hole, thereby to form a tiny extruded microbeam of any desired cross section. The resulting microbeam can have multiple uses such as solderless wire connections to the conductive billet segment, and flat panel field emission display tips having novel geometries, and inherently connected to the billet segments. Scanning tunneling microscope tips may also be readily fabricated. The ability to create an array of addressable tips might lead to large scale parallel probes that could enhance throughput. Thus, the normally detrimental electromigration forces are used to good advantage in the practice of the present invention.

BRIEF DESCRIPTION OF THE DRAWINGS

Other features and advantages of the invention will become more apparent upon study of the following detailed description, taken in conjunction with the drawings in which.

DETAILED DESCRIPTION OF PREFERRED EMBODIMENTS OF THE INVENTION

Figure 1:
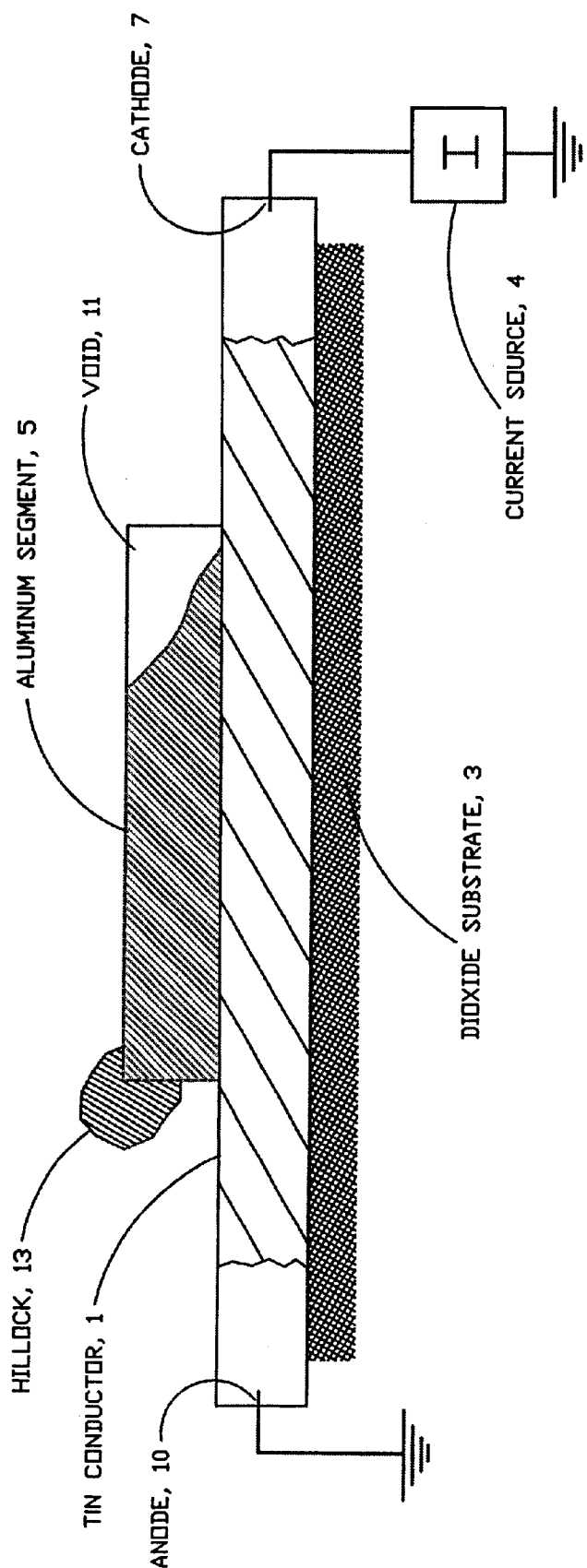
FIG. 1 illustrates a cross-section of a Blech-Kinsbron edge-displacement segment.

Twenty years ago Blech conducted experiments involving electromigration in aluminum conductor segments. See I. A. Blech "Electromigration in thin aluminum films on titanium nitride", Journal of Applied Physics, vol. 47, pages 1203–1208, 1976. In prior art FIG. 1, current is induced in a highly resistive TiN conductor 1, positioned on insulating silicon/silicon dioxide substrate 3, and between cathode 7 and anode 10, in turn coupled to current source 4. Electron flow from the cathode to the anode is shunted into the overlaying aluminum segment 5 having a resistivity 100 times lower than the resistivity of the titanium nitride conductor 1. The aforesaid electromigration causes Al to be removed from the segment to create a void 11 therein at a constant rate, displacing the trailing edge of the segment toward the anode 10, effectively shortening the length of the aluminum segment. Hillock 13 is formed as a result near the anode. The explanation of this effect is set forth in the aforesaid Blech publication, among others, and thus need not be further described in detail herein in the interests of brevity and economy.

Figure 2:
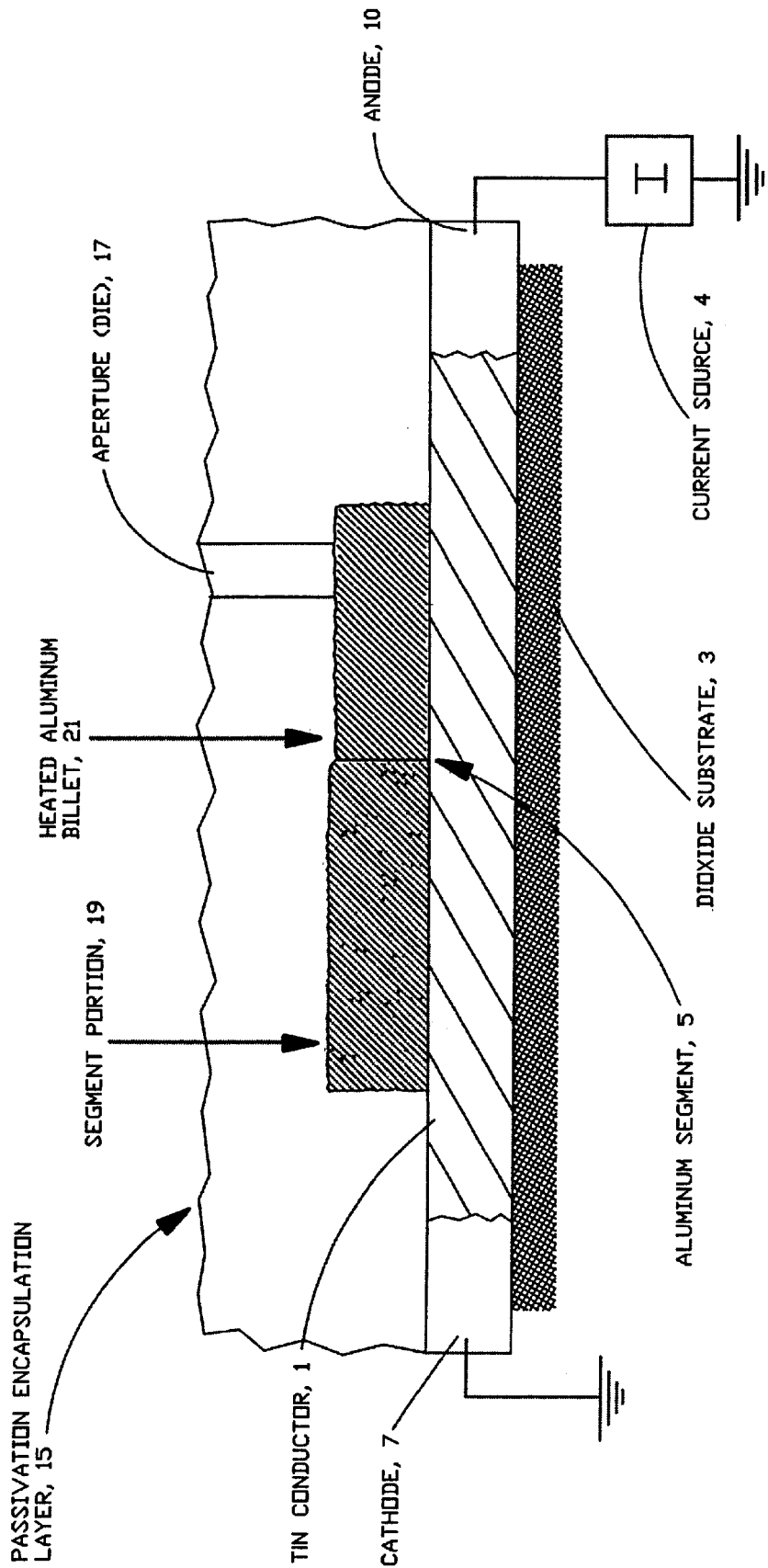
FIG. 2 schematically illustrates components involved in the method of the invention.
Figure 3:
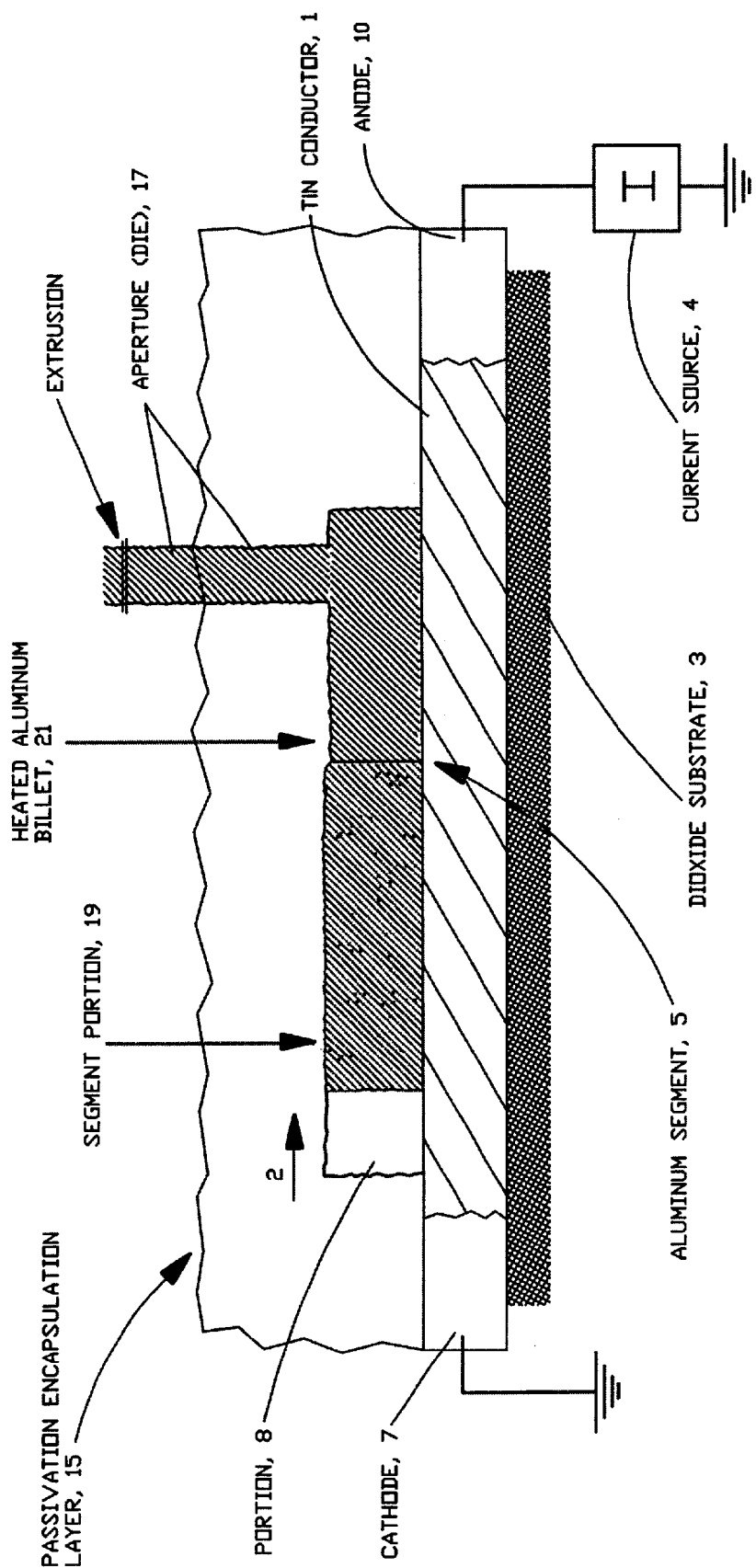
FIG. 3 illustrates schematically the aluminum segment acting as both the billet and extrusion ram.

In FIG. 2, a substantially planar passivation encapsulation layer 15 is formed over the aforesaid members, and aperture 17 is formed therein which functions as a die. The Al segment 5 of FIG. 1 corresponds functionally to heated Al billet 21 which is forced through the die opening 17 by the aforesaid electromigration forces. Electromigration of aluminum atoms from the left hand segment portion of 5 causes an increase in pressure at segment portion 19 to force the heated pliable aluminum through the die opening as indicated in FIG. 3. Arrow 2 indicates the displacement of the Al material to the right and portion 8 corresponds to void 11 of FIG. 1. The material now shown in the die opening 17 corresponds to the hillock 13 of FIG. 1.

The MEP passivation encapsulation 15 should comprise a non-conducting material, so as not to shunt the current from the billet material 21, and should be as rigid as possible. Suitable materials include silicon dioxide, silicon nitride, and other candidates such as sapphire, diamond, SiC and metal/insulator composites. Its rigidity can be increased by increasing its thickness, and the encapsulation layer should have adequate adhesion to substrate 3, because the compressive stress induced by electro-migration may be relieved by undesired delamination of the encapsulation passivation layer 15, as well as by the desired extrusion through the die opening. The die patterning of apertures 17 can be achieved by a typical pattern transfer using photoresist and reactive ion etching, but other patterning techniques that will not etch the billet such as use of a focused ion beam may be acceptable. The die opening 17 should be as close to the terminal end of the anode side as possible, to ensure that the maximum stress is produced under the extrusion die pattern.

Thus, the process of the invention involves positioning a planar electrically conductive Al billet segment 21 within a planar semiconductor passivation encapsulation layer 15, adjacent a die aperture 17 extending through the encapsulation layer, positioning a current carrying electrically conductive TiN substrate 1 in contact with the planar electrically conductive segment 21, the resistivity of the electrically conductive substrate being substantially greater than the resistivity of the planar electrically conductive segment, enabling current to be shunted through the Al segment and induce sufficient electro-migration forces within the Al segment to cause the material thereof to become deformable and flow through the aperture of the encapsulation layer. The extrusion times may be substantially reduced by heating the components to increase the pliability of the Al segment. The melting point can be approached to greatly decrease the extrusion time.

We deposited 100 mm TiN blanket film on oxidized 200 mm diameter Si wafers by reactive sputtering. The TiN film was patterned into sets of two conductors on 5 mm substrates with line widths of 5 microns and lengths of 270 microns. Al billet segments of 100 and 150 microns in length with 4 micron linewidths were patterned on the long TiN conductors by optical lithography, evaporation of the aluminum segment to a thickness of 0.5 microns, and liftoff. A 1.5 micron thick passivation layer of silicon dioxide coats the array of extrusion machines and a final etch process creates square and cross-shaped die patterns through the silicon dioxide passivation encapsulation 15. Current density was $16^6$ amps per square cm and for the bench experiments, the temperature was kept to about 200 degrees C, well below the melting point of the Al segment, prolonging the extrusion process to five days. Higher temperatures should reduce this time period. Elevated temperatures are employed to render the Al segment pliable, to enhance its ability to flow through the die opening.

These little extruders produced MEP extruded microbeam samples having a length of sixteenmicrons and about 0.4 microns in diameter. As mentioned above, these microbeams can be used as flat display panel electric field emitter tips and scanning tunneling probes. An important useful advantage of the process is that an electrical connection of the microbeams to the aluminum is automatically created. Being individually addressable, the microbeams can be used as field emitter pixel elements in flat panel TV image displays. They can also function as whiskers in independently addressable arrays of microprobes for large scanfield electron lithography. For further details relating to the present invention, reference may be made to a published paper, incorporated by reference herein, Frankovic et al., IEEE Electron Device Letters, vol. 18, no. Apr. 4, 1997, and a thesis of Richard Frankovic, Department of Electrical Engineering, Notre Dame University, Notre Dame Indiana, December 1996.

Numerous variations of the described method of the invention will occur to skilled workers in the art and thus the scope of the invention is to be limited solely to the terms of the following claims and art recognized equivalents thereof. For example, while the ram portion 19 and billet portion 21 were both previously described as being made of the same conductive material such as aluminum, the billet portion 21 could be made of another material such as an insulator, where it is desirable to extrude an electrical insulator rather than an electrical conductor.

A microextrusion process comprises the steps of making a structure as shown in FIG. 3 wherein an electrically conductive planar substrate 1, as further seen in FIG. 2, has a selected resistance and is deposited on an insulative substrate 3 then a non-conductive layer 21 is then deposited on the planar substrate 1. Using conventional processes, selected portions of the non-conductive layer 21 are removed to form at least one non-conductive segment being called a billet having a desired shape. Adjacent to this billet, a conductive layer 19 is then deposited on the conductive planar substrate 1 and then selected portions of the conductive layer 21 are removed to form a ram having a desired shape adjacent to the billet. The ram is made of a material having a lower resistance than the conductive planar layer thereunder so that any current flowing would enter this ram. A conductive encapsulation layer 15 is then deposited about the ram and the billet. Selective areas of this encapsulation layer 15 are removed to form a die opening through the encapsulation layer, said die opening having a given shape, said die opening being positioned over one end of the billet, and exposing a portion of the billet thereunder. In order to form the microextrusion, electrical leads are attached to the conductive planar substrate wherein a current will flow through the ram in the direction of the die opening to cause electromigration of the material comprising the billet, a part of the billet flowing through the die opening to form an elongated extruded member having the external shape of the die opening and being a unitary part of the billet. This process is similar to that required in FIG. 2 except the billet 21 is non-conducting. Heating of the billet material will further assist in the forming of the extruded member.

What is claimed is:

1. A micro-extrusion process comprising the steps of:
   (a) positioning an electrically conductive segment of aluminum material within an encapsulation member and adjacent an aperture extending through such encapsulation member, and wherein said encapsulation member encloses said electrically conductive segment and is tightly bonded to a substrate member, and wherein said encapsulation member is selected from the group consisting of silicon dioxide, silicon nitride, sapphire, diamond, silicon carbide and metal/insulator composites;
   (b) inducing sufficient electro migration forces within said electrically conductive segment of aluminum material to deform and flow through the aperture of said encapsulation member, thereby producing an elongated extruded member coupled to said electrically conductive segment; and
   (c) positioning a current carrying electrically conductive substrate in contact with said electrically conductive segment, the resistivity of said electrically conductive segment, enabling current to be shunted through said electrically conductive segment; and (d) heating said electrically conductive segment to a sufficient extent to enhance pliability of said electrically conductive segment and thereby reduce extrusion time periods while inducing sufficient electro migration forces within the electrically conductive segment to cause aluminum material to flow through a micro-sized die aperture, thereby producing an elongated extruded member coupled to said micro-sized electrically conductive segment.

2. A micro-extrusion process comprising the steps of:

a. selecting an electrically conductive planar substrate having a given resistance and depositioning on an insulative substrate;

b. depositing a non-conductive layer on the planar substrate;

c. removing selected portions of the non-conductive layer to form at least one non-conductive segment being called a billet having a desired shape;

d. depositing a conductive layer on the conductive substrate;

e. removing selected portions of the conductive layer to form a ram having a desired shape adjacent to the billet;

f. depositing a conductive encapsulation layer about the ram and the billet;

g. removing a portion of the encapsulation layer to form a micro sized die opening through the encapsulation layer, said die opening having a given shape, said die opening being positioned over one end of the billet and exposing a portion of the billet thereunder;

h. attaching electrical leads to the conductive planar substrate wherein a current will flow through the ram in the direction of the die opening; and i. inputting current through the conductive substrate and to the ram to cause electro migration of the material comprising the ram to push a part of the billet through the die opening to form an elongated extruded member having the external shape of the die opening and being a unitary part of the billet.

* * * * *